US005670918A

United States Patent [19]

Umezu

[11] Patent Number: 5,670,918

[45] Date of Patent: Sep. 23, 1997

[54] WAVEGUIDE MATCHING CIRCUIT HAVING BOTH CAPACITIVE SUSCEPTANCE REGULATING MEANS AND INDUCTIVE MATERIALS

[75] Inventor: Keiichi Umezu, Tokyo, Japan

[73] Assignee: NEC Corporation, Tokyo, Japan

[21] Appl. No.: 681,379

[22] Filed: Jul. 23, 1996

Related U.S. Application Data

[62] Division of Ser. No. 560,782, Nov. 21, 1995.

[30] Foreign Application Priority Data

Nov. 21, 1994 [JP] Japan .................................... 6-286930

[51] Int. Cl.[6] ................................ H03H 7/38; H01P 5/04

[52] U.S. Cl. ................................................ 333/33; 333/253

[58] Field of Search ................................ 333/33–35, 248, 333/253

[56] References Cited

U.S. PATENT DOCUMENTS

| | | | |
|---|---|---|---|
| 2,432,094 | 12/1947 | Fox | 333/34 X |
| 2,865,009 | 12/1958 | Litton | 333/34 |
| 2,922,127 | 1/1960 | Dench | 333/34 |
| 3,449,698 | 6/1969 | Cooper | 333/248 |
| 3,471,810 | 10/1969 | Mann | 333/248 X |
| 3,654,571 | 4/1972 | Rucker et al. | 333/21 R |
| 3,725,824 | 4/1973 | McDonald | 333/21 R |
| 4,623,848 | 11/1986 | Saka et al. | 330/286 |
| 4,803,446 | 2/1989 | Watanabe et al. | 333/26 |
| 5,111,164 | 5/1992 | De Ronde | 333/248 X |
| 5,387,884 | 2/1995 | Porcello | 333/33 |

FOREIGN PATENT DOCUMENTS

| | | | |
|---|---|---|---|
| A 0247794 | 12/1987 | European Pat. Off. . | |
| A 57 36006 | 8/1955 | Japan . | |
| A 61-27203 | 8/1986 | Japan . | |
| A 63-187707 | 8/1988 | Japan . | |
| 1190431 | 11/1985 | U.S.S.R. | 333/33 |
| A 934912 | 1/1962 | United Kingdom . | |
| WO84 04855 | 12/1984 | WIPO . | |

OTHER PUBLICATIONS

Patent Abstracts Of Japan, abstract of JP-A 53-054945, May 18, 1978.

Ohm-sha, "Microwave Circuit," Oct. 31, 1958, pp. 224–225.

G. Von Dall'Armi, "Brietbandiger und hochbelasbarer Übergang awischen einem Hohlleiter und einer Koaxialleitung," *Frequenz*, vol. 20, No. 8, Aug. 1966, pp. 270–272.

*Primary Examiner*—Benny Lee
*Assistant Examiner*—Barbara Summons
*Attorney, Agent, or Firm*—Sughrue, Mion, Zinn, Macpeak and Seas.

[57] ABSTRACT

A waveguide matching circuit in the form of a rectangular tube, open at both ends, and in which a high-frequency signal propagates along a central axis perpendicular to the open end; at least two screws for regulating a capacitive susceptance which are provided along a line having a predetermined angle to the axis line of the waveguide at a predetermined position on a wide face of the waveguide, and are respectively disposed at an interval of one eighth of a guide wavelength λg in the direction along the axis line; and at least two inductance rods narrowing the width between two internal sidewalls of the waveguide, disposed at the same interval as corresponding capacitive susceptance regulating screws.

3 Claims, 3 Drawing Sheets

WAVEGUIDE MATCHING CIRCUIT HAVING BOTH CAPACITIVE SUSCEPTANCE REGULATING MEANS AND INDUCTIVE MATERIALS

This is a divisional of application Ser. No. 08/560,782 filed Nov. 21, 1995.

FIELD OF THE INVENTION

This invention relates to a waveguide coaxial converter for a microwave circuit, and more particularly to, waveguide coaxial converter having a regulating means of load impedance.

BACKGROUND OF THE INVENTION

A waveguide coaxial converter is in general used for the conversion of the propagation mode of a high-frequency signal between a waveguide and a coaxial line. In such a waveguide coaxial converter, the impedance matching between a waveguide and a coaxial line and the biasing to a detector provided with the coaxial line is desired to be effectively achieved.

Japanese utility model publication No. 61-27203 discloses one type of a waveguide coaxial converter in which an insulating portion is provided at the connecting part between a ridge portion and an internal wall of the waveguide and a connecting conductor from the ridge portion is disposed through a small hole provided with the wall of the waveguide and the connecting conductor is used as a biasing terminal.

Japanese patent application laid-open No. 63-187707 discloses a waveguide coaxial converter in which a ridge waveguide band cross section is strictly calculated such that the cut-off frequency is lower than the operating frequency, thereby increasing the operating frequency to more than one octave, and a layered dielectric, varying the number of layers to achieve impedance matching.

Further, Japanese utility model application laid-open No. 57-36006 discloses a waveguide matching circuit in which a plurality of screws are deposited at intervals of λg/4 (λ:guide wavelength) on the feeding portion of the waveguide.

However, in the above conventional waveguide coaxial converter, the matching range does not cover both a capacitive region and an inductive region, i.e., it is limited to the capacitive region.

Further, since the conventional waveguide coaxial converter is in general separated from a regulating means of load impedance, there is a disadvantage that it must be made larger if it is connected with a waveguide with the regulating means of load impedance.

SUMMARY OF THE INVENTION

Accordingly, it is an object of the invention to provide a waveguide coaxial converter in which the matching range of susceptance can be extended over both a capacitive region and an inductive region.

It is a further object of the invention to provide a waveguide matching circuit in which the matching range of susceptance can be extended over both a capacitive region and an inductive region.

According to the invention, a waveguide coaxial converter, comprises:

a waveguide which has the cross section of a hollow rectangle plugged at one end, and in which a high-frequency signal propagates;

at least two means for regulating a capacitive susceptance which are provided along a line having a predetermined angle to an axis line of the waveguide at a predetermined position on a wide face of the waveguide and are respectively disposed at an interval of one eighth of a guide wavelength λg in the direction of the axis line; and at least a pair of step portions for stepwise narrowing the width between both internal sidewalls of the waveguide, each of the step portions being provided on the internal sidewalls respectively, wherein the step portions are placed with a distance of one eighth of the guide wavelength in the direction of the axis line.

According to another aspect of the invention, a waveguide matching circuit, comprises:

a waveguide for propagating a high-frequency signal in which means for regulating an impedance is provided;

wherein the impedance regulating means comprises:

at least two means for regulating a capacitive susceptance which are provided along a line having a predetermined angle to an axis line of the waveguide at a predetermined position on a wide face of the waveguide and are respectively disposed at an interval of one eighth of a guide wavelength λg in the direction of the axis line; and at least two inductive materials which are each located on a narrower internal sidewall of the waveguide in parallel with and at the same interval of the capacitive susceptance regulating means.

In the waveguide coaxial converter according to the invention, an inductive susceptance at the side of a load is increased by the step portions where the internal sidewalls are narrowed stepwise. However, due to the capacitive susceptance regulating means, the capacitive susceptance can be regulated. As a result, the impedance matching can be carried out over the wide range from an inductive region to a capacitive region.

Furthermore, due to the capacitive susceptance regulating means, which are provided along a line having a predetermined angle to an axis line of the waveguide at a predetermined position on a wide face of the waveguide and are respectively disposed at an interval of one eighth of a guide wavelength λg in the direction along the axis line, the overall length of the waveguide in the direction of the axis line can be significantly decreased. Moreover, the increase of the cutoff frequency caused by the step portions can be suppressed by the ridge portion with a proper shape.

In the waveguide matching circuit according to the invention, an inductive susceptance at the side of a load is increased by the inductive materials. However, due to the capacitive susceptance regulating means, the capacitive susceptance can be regulated. As a result, the impedance matching can be carried out over the wide range from an inductive region to a capacitive region.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a waveguide coaxial converter in the preferred embodiment, the aforementioned conventional waveguide coaxial converter will be explained in FIGS. 1A and 1B.

Figure 1A:
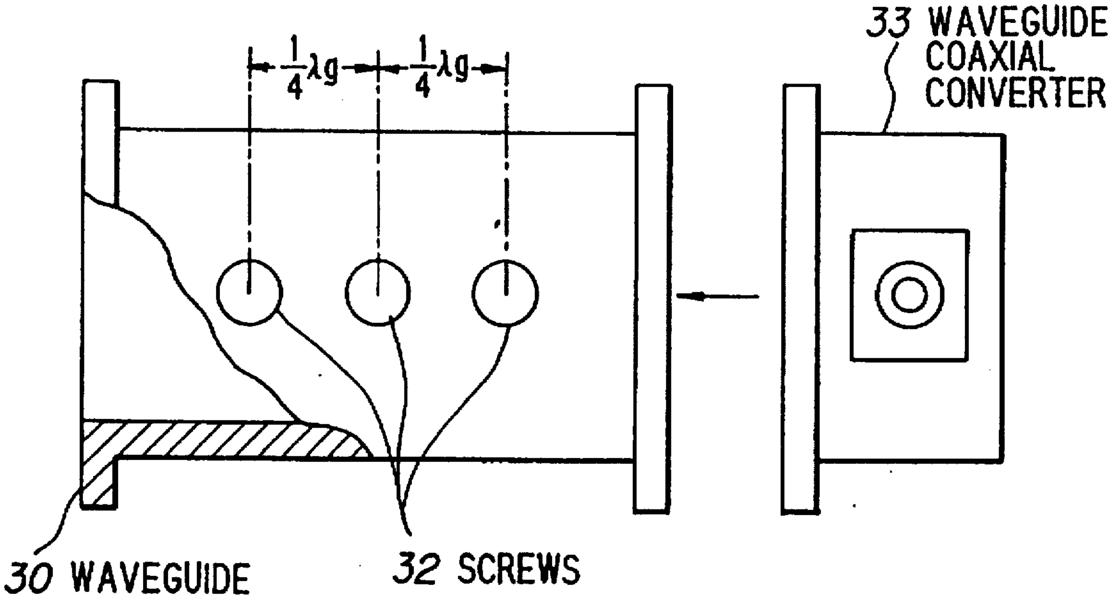
FIG. 1A PRIOR ART
FIG. 1A is a partially broken plan view showing a conventional waveguide coaxial converter in addition to a separated waveguide.
Figure 1B:
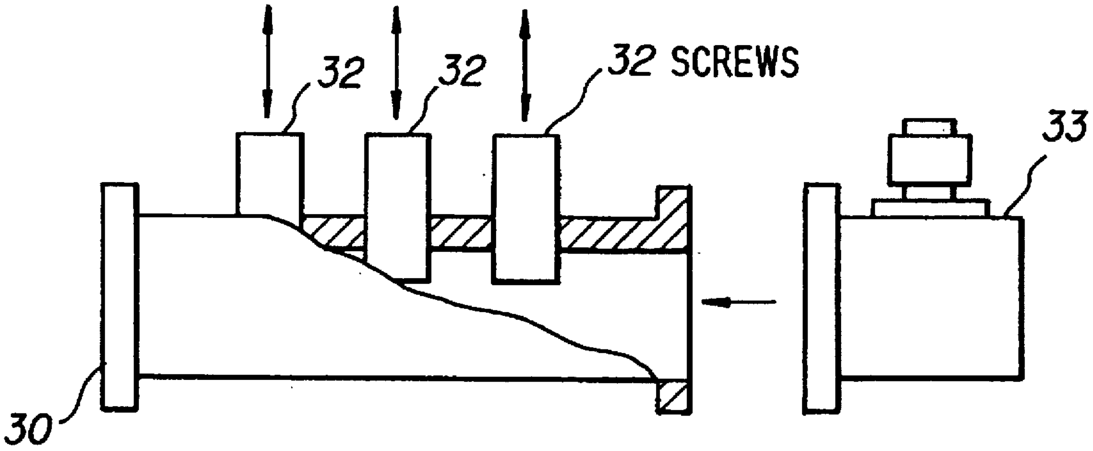
FIG. 1B PRIOR ART
FIG. 1B is a partially broken side view in FIG. 1A.

FIGS. 1A and 1B show a conventional waveguide coaxial converter in which three screws 32 for adjusting the amount of insertion vertical to the longitudinal axis thereof are arranged at respective intervals of λg/4 (see FIG. 1A) on the top of a waveguide 30. When regulating the impedance, a capacitive susceptance can be changed according to the respective amount of insertion of the screws 32 (designated by the vertical arrows in FIG. 1B). Therefore, the matching of impedance can be performed in a practical range, though it is not the full range.

When the waveguide coaxial converter comprises the waveguide 30 with such regulation mechanism of the impedance, a waveguide coaxial converter 33 which serves as an interface to a coaxial line is, as shown in FIG. 1A or 1B, attached to an opened end of the waveguide 30.

Next, a waveguide coaxial converter in a preferred embodiment will be explained in FIGS. 2A and 2B.

The waveguide coaxial converter 10 (see FIG. 2A) comprises step portions 11*a*, 11*b*, screws 12 for regulating a capacitive susceptance, a connector 13 for connecting the converter 10 with a coaxial line, a center conductor 14 in the connector 13 and a ridge portion 15.

Figure 2A:
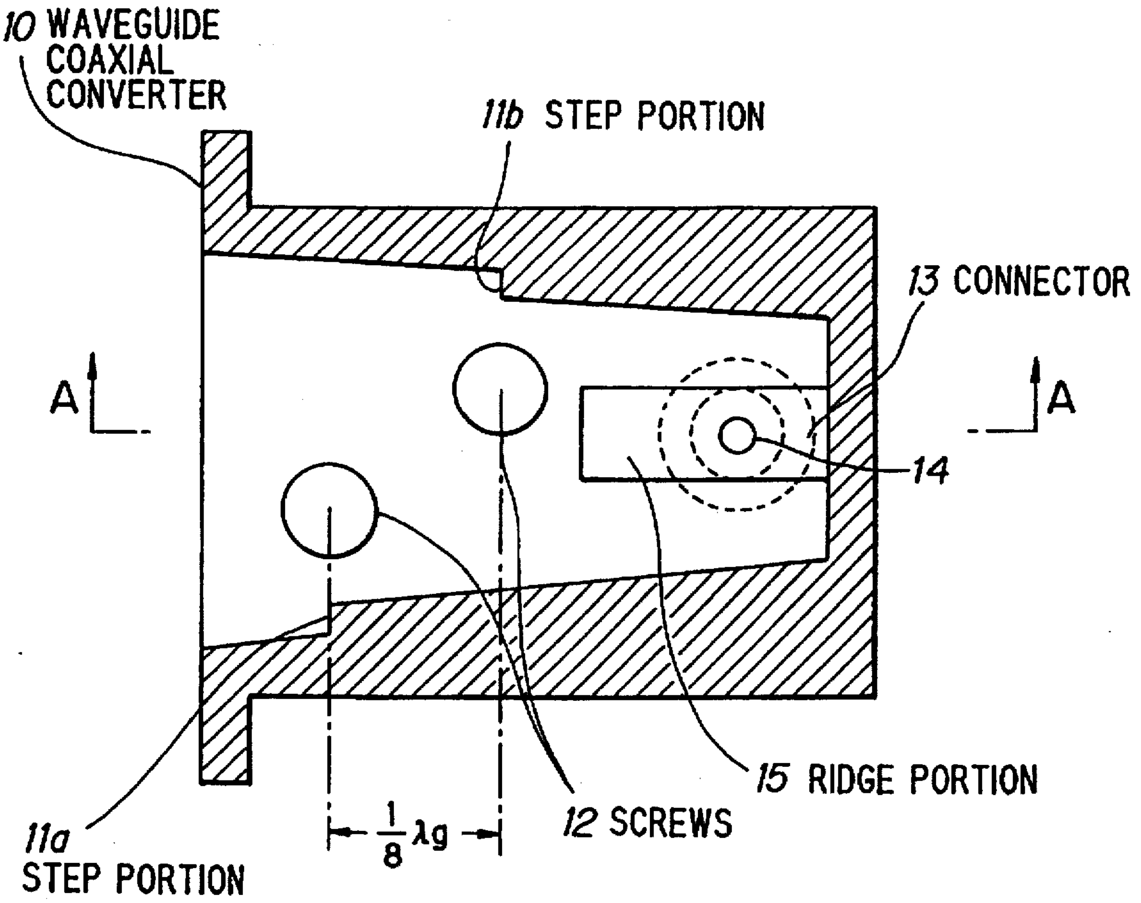
FIG. 2A is a cross sectional view showing a waveguide coaxial converter in a preferred embodiment according to the invention.

As shown in FIG. 2A, the internal narrow sidewalls in the waveguide coaxial converter 10 are tapered gradually narrowing the waveguide from the opened end toward the closed end. The step portions 11*a* and 11*b* formed on their respective inside walls are spaced apart by an interval of λg/8; as shown in FIG. 2A. The respective faces for forming the step portions 11*a* and 11*b* are parallel to the face on the opening of the waveguide coaxial converter 10. A pair of screws (means for regulating a capacitive susceptance) 12 in which the amount of insertion (designated by the vertical arrows in FIG. 2B) in the direction of the internal wide face can be optionally regulated, are arranged at predetermined positions on the internal wide face which respectively correspond to the positions of the step portions 11*a*, 11*b*.

Furthermore, to correct the increase of the cut-off frequency caused by the step portions 11*a*, 11*b*, a ridge portion 15 is formed in nearly the center of the internal wide face. The ridge portion 15 is, as shown in FIG. 2B, provided with a tapered face in which the thickness is gradually increased as it approaches the plugged end, and a flat face extending from the peak of the tapered face to the plugged end. A center conductor 14 of a coaxial line is attached to the flat face of the ridge portion 15.

In the waveguide coaxial converter 10 with such structure, as the amount of insertion of the screws 12 is changed, the attenuation of a high-frequency signal is changed. Namely, by making the amount of insertion of the screws 12 variable, the load impedance can be varied. Specifically, when the amount of insertion of the screws 12 is minimized, i.e., in the case of substantially extracting the screws 12 from the cavity, an inductive susceptance becomes predominant as a whole due to the step portions 11*a*, 11*b* formed on the internal sidewall. Therefore, regulating the capacitive susceptance by the amount of insertion of the screws 12 makes it possible that the regulation of the impedance as a whole is performed over the range from an inductive region to a capacitive region. As a result, the frequency range where the matching of impedance can be carried out is significantly enlarged.

Figure 2B:
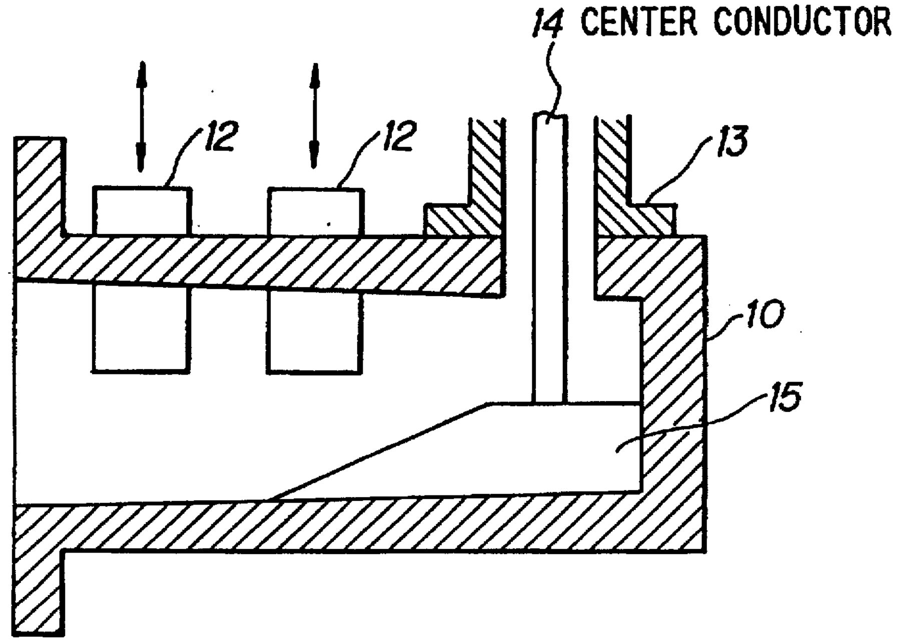
FIG. 2B is a cross sectional view cut along the line A—A in FIG. 2A.

Furthermore, since the ridge portion 15 is already present for reducing the cut-off frequency as shown in FIG. 2B, it can be also used for the impedance conversion between the waveguide and the coaxial line to provide an interface for the coaxial line. Thereby, the total scale can be reduced.

Moreover, such structure for the impedance conversion between the waveguide and the coaxial line in this embodiment is suitable for casting and does not need a supporting material such as Teflon® for the center conductor 14. Therefore, a waveguide coaxial converter for high power can be easily made at a reduced manufacturing cost.

Figure 3:
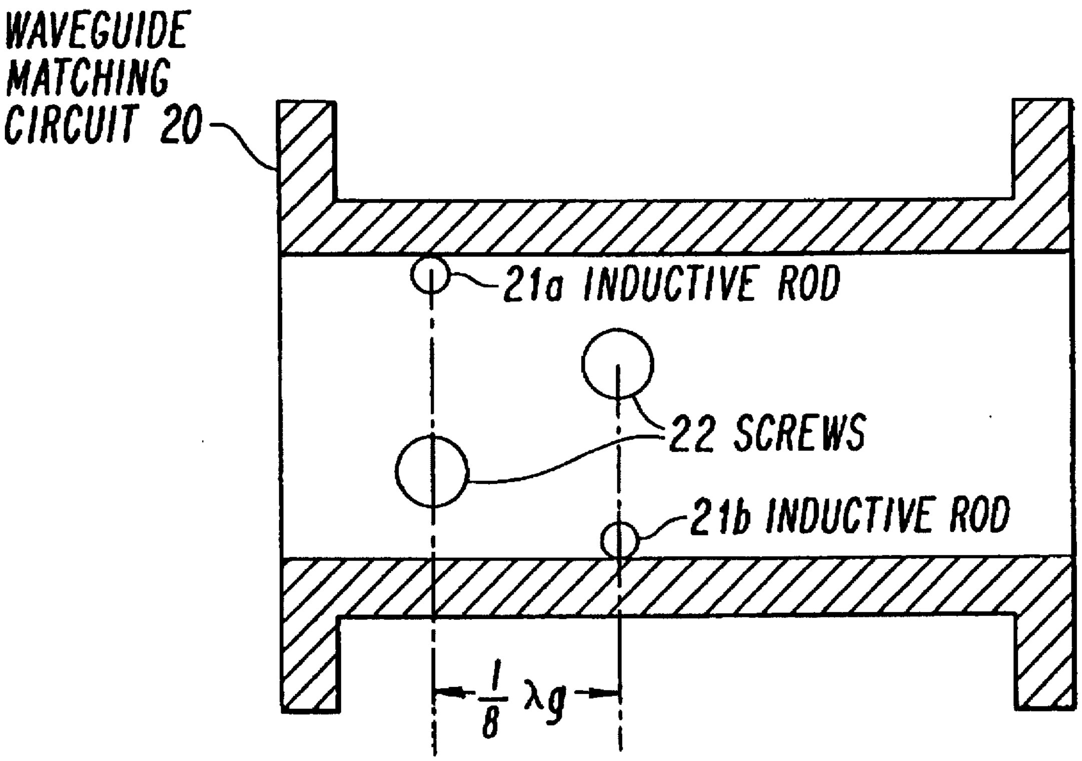
FIG. 3 is a cross sectional view showing a waveguide matching circuit in a preferred embodiment according to the invention.

FIG. 3 shows a waveguide matching circuit in a preferred embodiment of the invention. The waveguide matching circuit 20 comprises inductive rods 21*a*, 21*b* and screws 22 for regulating a capacitive susceptance.

As shown in FIG. 3, the waveguide matching circuit 20 has the inductive rods 21*a* and 21*b* which are disposed at an interval of λg/8 on a narrow pair of opposing internal sidewalls replacing the step portions 11*a*, 11*b* in the waveguide coaxial converter 10 as mentioned above with regard to FIG. 2A. Further, a pair of screws 22 are disposed on the same planes as the respective inductive rods 21*a*, 21*b*. The screws 22 are the same ones as the screws 12 in the waveguide coaxial converter as mentioned above with regard to FIG. 2A.

In operation, when the amount of insertion of the screws 22 is minimized, i.e., in the case of substantially extracting the screws 22 from the cavity, an inductive susceptance becomes predominant as a whole due to the inductive rods 21*a*, 21*b*. Therefore, regulating the capacitive susceptance by the amount of insertion of the screws 22 makes it possible that the regulation of the impedance as a whole is performed over the range from an inductive region to a capacitive region. As a result, the frequency range where the matching of impedance can be carried out is significantly enlarged.

Meanwhile, the number of the step portions 11*a*, 11*b* (see FIG. 2A) or the inductive rods 21*a*, 21*b* (see FIG. 3) is not limited to two.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A waveguide matching circuit, comprising:

a waveguide in the form of a rectangular tube having open ends, a central axis line perpendicular to the planes of the open ends, a pair of opposing internal wide faces, and a narrow pair of opposing internal sidewalls in which a high-frequency signal propagates, and in which means for regulating an impedance is provided; wherein said impedance regulating means comprises:

at least two means for regulating a capacitive susceptance arranged along a line having a predetermined non-zero angle with respect to the central axis line of said waveguide at a predetermined position on at least one wide face of said waveguide and respectively disposed at an interval of one eighth of a guide wavelength λg in the direction along said central axis line; and at least two inductive materials which are disposed on at least one of said opposing internal sidewalls of said waveguide at the same interval as corresponding ones of said capacitive susceptance regulating means.

2. A waveguide matching circuit, according to claim 1, wherein:

at least one of said capacitive susceptance regulating means and a corresponding one of said inductive materials are located in a respective plane perpendicular to said central axis line of said waveguide.

3. A waveguide matching circuit, according to claim 1, wherein:

each of said inductive materials is disposed along a respective one of said opposing internal sidewalls.

* * * * *

UNITED STATES PATENT AND TRADEMARK OFFICE
CERTIFICATE OF CORRECTION

PATENT NO. : 5,670,918
DATED : September 23, 1997
INVENTOR(S) : Keiichi UMEZU

It is certified that error(s) appears in the above-identified patent and that said Letters Patent is hereby corrected as shown below:

Col. 1, line 35, after "dielectric" insert --is provided at the opening of the waveguide--.

Col. 3, line 64, change "total scale" to --overall length of the waveguide--.

Signed and Sealed this

Twenty-third Day of June, 1998

*Attest:*

BRUCE LEHMAN

*Attesting Officer* *Commissioner of Patents and Trademarks*